United States Patent [19]

Nakamura et al.

[11] Patent Number: 5,405,809
[45] Date of Patent: Apr. 11, 1995

[54] SEMICONDUCTOR DEVICE, AN IMAGE SENSOR DEVICE, AND METHODS FOR PRODUCING THE SAME

[75] Inventors: Tetsuro Nakamura, Takarazuka; Eiichiro Tanaka, Osaka; Shinji Fujiwara, Kobe; Masahiro Nakagawa, Osaka, all of Japan

[73] Assignee: Matsushita Electric Industrial Co., Ltd., Osaka, Japan

[21] Appl. No.: 264,530

[22] Filed: Jun. 23, 1994

Related U.S. Application Data

[62] Division of Ser. No. 131,125, Oct. 4, 1993.

[30] Foreign Application Priority Data

Oct. 2, 1992 [JP] Japan .................. 4-264512
Jun. 10, 1993 [JP] Japan .................. 5-138221

[51] Int. Cl.⁶ ............................................. H01L 21/60
[52] U.S. Cl. ..................................... 437/209; 437/211; 437/212; 437/216; 437/220
[58] Field of Search ............... 437/290, 211, 212, 214, 437/215, 216, 217, 219, 220; 257/778, 680

[56] References Cited

U.S. PATENT DOCUMENTS

| | | |
|---|---|---|
| 4,749,120 | 6/1988 | Hatada . |
| 4,997,791 | 3/1991 | Ohuchi et al. .............. 437/209 |
| 5,037,780 | 8/1991 | Fujimoto et al. ............ 437/212 |
| 5,065,006 | 11/1991 | Nakamura et al. . |
| 5,071,787 | 12/1991 | Mori et al. .................. 437/212 |
| 5,079,190 | 1/1992 | Mihara ........................ 437/220 |
| 5,138,145 | 8/1992 | Nakamura et al. . |
| 5,264,393 | 11/1993 | Tamura et al. .............. 437/216 |

FOREIGN PATENT DOCUMENTS

| | | |
|---|---|---|
| 0262580 | 4/1988 | European Pat. Off. . |
| 0388011 | 9/1990 | European Pat. Off. . |
| 0393206 | 10/1990 | European Pat. Off. . |
| 4-137663 | 5/1992 | Japan .................. 257/680 |
| 4-155866 | 5/1992 | Japan .................. 257/778 |

OTHER PUBLICATIONS

*Electronics Letters*, vol. 26, No. 18, pp. 1484–1486 (Aug. 30, 1990).
European Search Report for Corresponding Application No. EP 93 11 5902, date mailed Dec. 30, 1993.

*Primary Examiner*—Brian E. Hearn
*Assistant Examiner*—Kevin M. Picardat
*Attorney, Agent, or Firm*—Ratner & Prestia

[57] ABSTRACT

A semiconductor device according to the present invention includes: a light-transmitting substrate having a first surface and a second surface; a circuit conductor layer formed on the first surface of the light-transmitting substrate; a semiconductor chip having electrodes formed on a surface thereof, the semiconductor device being mounted face-down on the first surface of the light-transmitting substrate; a photo-thermal cross-linkable insulating resin layer for fixing the semiconductor chip on the light-transmitting substrate; a plated metal layer formed on at least a portion of the circuit conductor layer, the electrodes of the semiconductor chip being connected to the circuit conductor layer through the plated metal layer; an alloy layer formed in an abutting portion between each plated metal layer and the circuit conductor layer; and a second alloy layer formed in an abutting portion between each electrode and each plated metal layer, the alloy layers being formed by melting and recoagulating the plated metal layer upon the circuit conductor layer.

14 Claims, 5 Drawing Sheets

| | THERMO-HYGRO STATIC (85°C 85%) 1000hr | HEAT SHOCK (-30°C ↔ +70°C) 0.5HR 0.5HR 200 CYCLES |
|---|---|---|
| CURED BY LIGHT-IRRADIATION (FIRST CURING) ONLY | 28/70 DEVICES | 30/56 DEVICES |
| CURED BY LIGHT-IRRADIATION (FIRST CURING) AND HEAT TREATMENT (SECOND CURING) | 70/70 DEVICES | 56/56 DEVICES |

RESULTS OF ENVIRONMENTAL TEST
(MOUNTING YIELD)

SEMICONDUCTOR DEVICE, AN IMAGE SENSOR DEVICE, AND METHODS FOR PRODUCING THE SAME

This application is a division of application Ser. No. 8/131,125, filed Oct. 4, 1993, pending.

BACKGROUND OF THE INVENTION

1. Field of the Invention:

The present invention relates to a semiconductor device in which a semiconductor chip is mounted, a method for fabrication thereof, an image sensor device for reading image information from a written/printed manuscript and the like, and a method for fabrication thereof.

2. Description of the Related Art

There are conventionally known methods for mounting a semiconductor chip such as an LSI (Large Scale Integrated Circuit) on a wiring board. Examples of such methods are a wire-bonding method, a flip-chip-bonding method, a film-carrier-bonding method, and a beam-lead-bonding method.

In a wire-bonding method, the semiconductor chip is fixed by means of an electrically conductive adhesive on a substrate having a circuit conductor layer formed thereon. Electrodes on the semiconductor chip are connected to the circuit conductor layer by means of metal wires such as those made of Au or Al. However, the bonding process in a wire-bonding method is troublesome using the metal wires. Moreover, it is necessary to form the electrodes of the semiconductor chip in a peripheral portion of the semiconductor chip, making it difficult to reduce the pitch between adjoining electrodes. Therefore, it is difficult to apply such a wire-bonding method to mounting of a semiconductor chip having a large number of electrodes. In order to solve such a problem, U.S. Pat. Nos. 5,065,006 and 5,138,145 each discloses a method for mounting an image sensor chip in an image sensor device, as a method for mounting a semiconductor chip through a wireless-bonding method.

The methods for producing a conventional image sensor device, as are disclosed in the above patents, will be described with reference to FIGS. 8 and 9. FIG. 8 is a cross-sectional view showing a conventional image sensor device, in which an image sensor chip 16 is mounted face-down on a transparent substrate 11.

The image sensor device shown in FIG. 8 is fabricated in the following manner: As is shown in FIG. 8, a photo-curable insulating resin 18 is applied on the transparent substrate 11. The transparent substrate 11 has a circuit conductor layer 12 formed thereon. Thereafter, the image sensor chip 16, which includes electrodes 15 and light-sensitive elements 19 such as photodiodes, is pressed face-down on the transparent substrate 11. While a pressure is applied, the photo-curable insulating resin 18 is irradiated with ultra violet rays through the transparent substrate 11, so that the photo-curable insulating resin is cured, and the image sensor chip 16 is fixed on the substrate. Finally, a resin such as that of a silicon type is applied thereon to form a passivation layer 17. Thus, the image sensor device is fabricated.

FIG. 9 shows a step in the fabrication process of another conventional image sensor device. The image sensor device shown in FIG. 9 is fabricated in the following manner: As is shown in FIG. 9, an image sensor chip 26 has electrodes 25 formed thereon. On each electrode 25, another electrode (bump) 24 is formed. Each bump 24 has a ring tab formed at a tip portion thereof. The bumps 24 abut a circuit conductor layer 22 formed on a substrate 21 when the image sensor chip 26 is mounted face-down on the substrate 21. By applying a pressure on the image sensor chip 26, the ring tabs of the bumps 24 collapse, so that the circuit conductor layer 22 and the bumps 24 are connected to each other in a close contact.

As is described above, in the first conventional method, the photo-curable insulating resin is cured by being irradiated with ultra violet rays through the transparent substrate. Therefore, a portion of the photo-curable insulating resin which is shaded by the circuit conductor layer formed on the transparent substrate may not be sufficiently irradiated with the ultra violet rays, and therefore may not be cured completely. In such cases, since the photocurable insulating resin is not completely cured, the physical connection between the semiconductor chip and the substrate is insufficient, causing the device to have poorer physical endurance. Moreover, the semiconductor chip and the circuit conductor layer are likely to have poor electrical connection. Furthermore, in cases where the device is an image sensor device, since the insulating resin is not completely cured, optical characteristics thereof are likely to lack uniformity, causing various problems. For example, if the resin has portions having different refractive indices, light incident to the device is refracted and/or scattered thereby. As a result, the light-sensitive element tends to read images with errors, or the resolution of the read images are degraded.

With respect to the second conventional method, since the ring tabs of the bumps are collapsed by applying a certain level of pressure or more thereto, the image sensor chip and/or the transparent substrate may be destroyed in some cases. Furthermore, the circuit conductor layer and the bumps (electrodes) may have poor electrical connection. The reasons are: the contact between the circuit conductor layer and the bumps may be insufficient because the contact is obtained through physical deformation of the bumps; it is difficult to substantially offset such factors as variations in the heights of the electrodes, bumps (electrodes), and the circuit conductor layer and warping of the image sensor chip and/or the transparent substrate.

SUMMARY OF THE INVENTION

A semiconductor device according to the present invention comprises: a light-transmitting substrate having a first surface and a second surface; a circuit conductor layer formed on the first surface of the light-transmitting substrate; a semiconductor chip having electrodes formed on a surface thereof, the semiconductor device being mounted face-down on the first surface of the light-transmitting substrate; a photo-thermal cross-linkable insulating resin layer for fixing the semiconductor chip on the light-transmitting substrate; a plated metal layer formed on at least a portion of the circuit conductor layer, the electrodes of the semiconductor chip being connected to the circuit conductor layer through the plated metal layer; and an alloy layer formed in an abutting portion between each plated metal layer and the circuit conductor layer, the alloy layer being formed by melting and recoagulating the plated metal layer upon the circuit conductor layer.

In one embodiment of the invention, the semiconductor device further comprises a second alloy layer formed in an abutting portion between each electrode and each plated metal layer.

In another embodiment of the invention, the plated metal layer is made of solder.

In still another embodiment of the invention, the semiconductor device further comprises a metal bump formed on each electrode, each metal bump being connected to the circuit conductor layer through each plated metal layer; and a second alloy layer formed in an abutting portion between each metal bump and each plated metal layer, the second alloy layer being formed by melting and recoagulating the plated metal layer.

In still another embodiment of the invention, the metal bumps are made of Au.

A method for producing a semiconductor device according to the present invention comprises the steps of: forming a circuit conductor layer on a first surface of a light-transmitting substrate having the first surface and a second surface; forming a plated metal layer on at least a portion of the circuit conductor layer; forming a photo-thermal cross-linkable insulating resin layer on the first surface of the light-transmitting substrate; disposing a semiconductor chip having electrodes on a surface thereof face-down so that the electrodes are in contact with the plated metal layer; conducting a first curing step for curing the photo-thermal cross-linkable insulating resin by radiating ultra violet rays through the light-transmitting substrate from the second surface of the light-transmitting substrate while pressing the semiconductor chip against the light-transmitting substrate; and conducting a second curing step for further curing the photo-thermal cross-linkable insulating resin by heating the light-transmitting substrate with the semiconductor chip disposed thereon at a certain temperature for a period of time, the temperature being higher than the melting point of the plated metal layer and than the curing temperature of the photo-thermal cross-linkable resin.

In one embodiment of the invention, the second curing step further comprises a step for forming an alloy layer in an abutting portion between each plated metal layer and the circuit conductor layer and for forming a second alloy layer in an abutting portion between each plated metal layer and each electrode, the alloy layers being formed by melting the plated metal layer.

In another embodiment of the invention, the semiconductor chip further comprises a metal bump formed on each electrode, and the second curing step further comprises a step for forming an alloy layer in an abutting portion between each plated metal layer and the circuit conductor layer and for forming a second alloy layer in an abutting portion between each metal bump and each plated metal layer, the alloy layers being formed by melting the plated metal layer.

In still another embodiment of the invention, the second curing step is conducted while the semiconductor chip is pressed against the light-transmitting substrate.

In still another embodiment of the invention, the step for forming the circuit conductor layer includes: a step for forming a conductor layer on the first surface of the light-transmitting substrate; and a step for forming the circuit conductor layer by patterning the conductor layer by a photolithography method.

In still another embodiment of the invention, the step for forming the circuit conductor layer is conducted by attaching a flexible printed wiring board to the first surface of the light-transmitting substrate.

An image sensor device according to the present invention comprises: a light-transmitting substrate having a first surface and a second surface; a circuit conductor layer formed on the first surface of the light-transmitting substrate; an image sensor chip having electrodes and at least one light-sensitive element formed on a surface thereof, the image sensor device being mounted face-down on the first surface of the light-transmitting substrate; a photo-thermal cross-linkable insulating resin layer for fixing the image sensor chip on the light-transmitting substrate, a plated metal layer formed on at least a portion of the circuit conductor layer, the electrodes of the image sensor chip being connected to the circuit conductor layer through the plated metal layer; and an alloy layer formed in an abutting portion between each plated metal layer and the circuit conductor layer, the alloy layer being formed by melting and recoagulating the plated metal layer upon the circuit conductor layer.

In one embodiment of the invention, the image sensor device further comprises a second alloy layer formed in an abutting portion between each electrode and each plated metal layer.

In another embodiment of the invention, the plated metal layer is made of solder.

In still another embodiment of the invention, the image sensor device further comprises: a metal bump formed on each electrode, each metal bump being connected to the circuit conductor layer through each plated metal layer; and a second alloy layer formed in an abutting portion between each metal bump and each plated metal layer, the second alloy layer being formed by melting and recoagulating the plated-metal layer.

In still another embodiment of the invention, the metal bumps are made of Au.

In still another embodiment of the invention, a sum total of the thickness of the light-transmitting substrate and the thickness of the photo-thermal cross-linkable insulating resin layer is 150 $\mu$m or less.

A method for producing an image sensor device according to the present invention comprises the steps of: forming a circuit conductor layer on a first surface of a light-transmitting substrate having the first surface and a second surface of forming a plated metal layer in at least a portion of the circuit conductor layer; forming a photo-thermal cross-linkable insulating resin layer on the first surface of the light-transmitting substrate; disposing an image sensor chip having electrodes and at least one light-sensitive element on a surface thereof face-down so that the electrodes are in contact with the plated metal layer; conducting a first curing step for curing the photo-thermal cross-linkable insulating resin by radiating ultra violet rays through the light-transmitting substrate from the second surface of the light-transmitting substrate while pressing the image sensor chip against the light-transmitting substrate; and conducting a second curing step for further curing the photo-thermal cross-linkable insulating resin by heating the light-transmitting substrate with the image sensor chip disposed thereon at a certain temperature for a period of time, the temperature being higher than the melting point of the plated metal layer and than the curing temperature of the photo-thermal cross-linkable resin.

In one embodiment of the invention, the second curing step further comprises a step for forming an alloy layer in an abutting portion between each plated metal layer and the circuit conductor layer and for forming a second alloy layer in an abutting portion between each plated metal layer and each electrode, the alloy layers being formed by melting the plated metal layer.

In another embodiment of the invention, the semiconductor chip further comprises a metal bump formed on each electrode, and the second curing step further comprises a step for forming an alloy layer in an abutting portion between each plated metal layer and the circuit conductor layer and for forming a second alloy layer in an abutting portion between each metal bump and each plated metal layer, the alloy layers being formed by melting the plated metal layer.

In still another embodiment of the invention, the second curing step is conducted while the image sensor chip is pressed against the light-transmitting substrate.

In still another embodiment of the invention, a sum total of the thickness of the light-transmitting substrate and the thickness of the photo-thermal cross-linkable insulating resin layer is 150 μm or less.

In still another embodiment of the invention, the step for forming the circuit conductor layer includes: a step for forming a conductor layer on the first surface of the light-transmitting substrate; and a step for forming the circuit conductor layer by patterning the conductor layer by a photolithography method.

In still another embodiment of the invention, the step for forming the circuit conductor layer includes a step for forming the circuit conductor layer by attaching a flexible printed wiring board to the first surface of the light-transmitting substrate.

In still another embodiment of the invention, the step for forming the circuit conductor layer includes a step for forming the circuit conductor layer on the first surface of the light-transmitting substrate by a thick-film printing method.

According to the present invention, electrodes (or bumps) formed on a semiconductor chip or an image sensor chip can have a firm electrical connection to a circuit conductor layer formed on a substrate, since plated metal layers are formed on the circuit conductor layer. Therefore, a reliable semiconductor device and a reliable image sensor device can be provided. Moreover, the semiconductor device and the image sensor device each can be firmly mounted on a light-transmitting substrate, since a photo-thermal cross-linkable insulating resin included therein is completely cured through first and second curing steps, greatly improving the mounting yield of the devices. Moreover, the semiconductor device and the image sensor device are prevented from deterioration, leading to improvement in the endurance thereof.

Thus, the invention described herein makes possible the advantages of (1) providing a semiconductor device and an image sensor device having high reliability, in which an insulating resin is completely cured and electrodes of a semiconductor chip have a firm electrical connection with a circuit conductor layer formed on a substrate, and (2) providing methods for producing such a semiconductor device and an image sensor device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying drawings.

Figure 1:
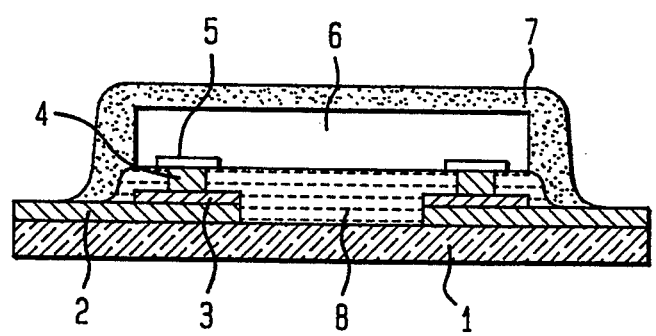
FIG. 1 is a view showing a front cross-section of a semiconductor device according to the present invention.

FIG. 1 shows a cross-section of a semiconductor device according to the present invention. A light-transmitting substrate 1 is a glass substrate, but may alternatively be a transparent film made of polyarylate (PA), polyethersulfone (PES), polyethylene terephthalate (PET), polyethylene naphthalate (PEN), or the like. The light-transmitting substrate 1 has a first surface (top face) and a second surface (bottom face). On the first surface of the light-transmitting substrate 1, a circuit conductor layer 2 made of a metal such as Cu or Al is formed. A semiconductor chip 6 having electrodes 5 formed on a surface thereof is mounted face-down on the first surface of the light-transmitting substrate 1. Various devices may optionally be formed on the semiconductor chip 6. On each electrode 5 of the semiconductor chip 6, a metal bump 4 is formed. In the present example, the metal bumps 4 are made of Au. However, the metal bumps 4 are not essential components of a semiconductor device according to the present invention.

Between the semiconductor chip 6 and the light-transmitting substrate 1, a photo-thermal crosslinkable insulating resin layer 8 is formed so as to fix the semiconductor chip 6 on the light-transmitting substrate 1. The photo-thermal cross-linkable insulating resin is an acrylate-type transparent resin in the present example, but may alternatively be a methacrylate-type resin, or the like. Generally speaking, a photo-thermal cross-linkable insulating resin is cured by being irradiated with light. Strictly speaking, however, a photo-thermal cross-linkable insulating resin includes those which are to be cured by being irradiated with light but are: not to be cured by being heated. The photo-thermal cross-linkable insulating resins used in the present application can be cured by not only light-irradiation but also heat treatment. The electrodes 5 of the semiconductor chip 6 are connected to the circuit conductor layer 2 by way of plated metal layers 3 formed in at least a portion of the circuit conductor layer 2. More specifically, the plated metal layers 3 are melted on the circuit conductor layer 2 and thereafter are recoagulated thereon so as to form an alloy layer in an abutting portion between each plated metal layer 3 and the circuit conductor layer 2. At the same time, the plated metal layers 3 are melted on the metal bumps 4 as well, so as to form an alloy layer in an abutting portion between each plated metal layer 3 and each metal bump 4. The metal bumps 4 are thus connected to the circuit conductor layer 2, by way of the alloy layers formed in the abutting portions between the metal bumps 4 and the plated metal layers 3 and by way of the alloy layers formed in the abutting portions between the plated metal layers 3 and the circuit conductor layer 2. In cases where no metal bump is provided, an alloy layer is formed in an abutting position between each electrode 5 and each plated metal layer 3 in a similar process to that mentioned above, while an alloy layer is similarly formed in the abutting portion between each plated metal layer 3 and the circuit conductor layer 2. The plated metal layers 3 can be made of solder of an In/Ga group, an In/Sn group, or a Pb/Sn group in both cases.

Hereinafter, a method for producing the above-mentioned semiconductor device will be described.

First, the semiconductor chip 6 is fabricated in the following manner: By a semiconductor fabrication process, various device elements (not shown) and the electrodes 5 are formed on a single-crystal silicon substrate (silicon wafer). The metal bumps 4 are formed on the electrodes 5 by such methods as an electric plating method and a ball-bonding method. The metal bumps 4 are made of Au in the present example. Then, the silicon wafer is cut out by a fine dicing technique so as to form the semiconductor chip 6.

Next, the circuit conductor layer 2 is formed on the first surface of the light-transmitting substrate 1. The light-transmitting substrate 1 is a glass substrate, but may alternatively be a transparent film made of polyarylate (PA), polyethersulfone (PES), polyethylene terephthalate (PET), polyethylene naphthalate (PEN), or the like. The circuit conductor layer 2 may be formed by depositing a layer of metal such as Cu or Al on the light-transmitting substrate 1 by a sputtering method, a vapor deposition method or the like and then patterning the deposited layer by a photolithography method. The circuit conductor layer 2 may alternatively be formed using a metal foil or the like. Moreover, the circuit conductor layer 2 may alternatively be formed by attaching a flexible printed wiring board to the first surface of the light-transmitting substrate 1.

Moreover, the plated metal layers 3 are formed in prescribed portions of the circuit conductor layer 2 by an electrolysis method, a non-electrolysis method, or other known methods.

Then, the photo-thermal cross-linkable insulating resin layer 8 is formed by applying a prescribed amount of an acrylate-type transparent insulating resin to be cured by use of both light and heat to a prescribed portion of the first surface of the light-transmitting substrate 1 by a stamping method, a screen printing method, etc. The semiconductor chip 6 having the electrodes 5 and the like on a surface thereof is disposed face-down on the photo-thermal cross-linkable insulating resin layer 8 so that the electrodes 5 abut the plated metal layers 3. Then, while the semiconductor chip 6 is pressed onto the light-transmitting substrate 1, the photo-thermal cross-linkable insulating resin layer 8 is irradiated with ultra violet rays through the light-transmitting substrate 1 so as to be cured (First curing step). Herein, the ultra violet rays are radiated from the second surface of the light-transmitting substrate 1 onto the photo-thermal cross-linkable insulating resin layer 8. At this first curing step, a pressure in the range of 0.5 kgf to 2.5 kgf is applied to the semiconductor chip 6 from above. While the above-mentioned pressure is applied to the semiconductor chip 6, the photo-thermal cross-linkable insulating resin layer 8 is irradiated with ultra violet rays having an intensity in the range of 200 mW to 500 mW for 0.5 to 2 minutes.

Then, the light-transmitting substrate 1 with the semiconductor chip 6 disposed thereon is placed in an electric furnace so as to be heated at a certain temperature for a while so that the photo-thermal cross-linkable insulating resin is further cured (Second curing step). The temperature should be higher than the melting point of the plated metal layers 3 and than the curing temperature of the photo-thermal cross-linkable insulating resin. In cases where eutectic solder is used as the plated metal layers 3, the heat treatment is conducted at a temperature in the range of 185° C. to 200° C. for about 5 to 30 minutes. In the present example, the heat treatment is conducted at 190° C. for 10 minutes. At the second curing step, the plated metal layers 3 are melted so that alloy layers are formed in abutting portions between the metal bumps 4 and the plated metal layers 3, and in abutting portions between the plated metal layers 3 and the circuit conductor layer 2.

The following effects are obtained by melting the plated metal layers 3 at the above-mentioned second curing step: Since each plated metal layer 3 becomes liquid so as to have a configuration with minute superficial rises and falls corresponding to those of the abutting portion of each electrode 5, the plated metal layers 3 and the electrodes 5 can contact in a larger area. Moreover, the alloy layers are more easily formed in the above-mentioned abutting portions, thus further securing the connection between the plated metal layers 3 and the electrodes 5. Moreover, if organic dusts are present on surfaces of the plated metal layers 3 and the electrodes 5, such organic dusts can be removed.

At the first curing step, a portion of the photo-thermal cross-linkable insulating resin which is in the shade of the circuit conductor layer 2 formed on the light-transmitting substrate 1 remains uncured. That portion of the photo-thermal cross-linkable insulating resin is, however, completely cured during the second curing step, so that the mounting of the semiconductor chip 6 is completed. The heat treatment at the second curing step is conducted while a pressure of 0 to 1.0 kgf is applied to the semiconductor chip 6 from above so that the semiconductor chip 6 is pressed against the light-transmitting substrate 1.

After the mounting of the semiconductor chip 6 is completed, a resin such as that made of silicon is applied by means of a dispenser, etc. on a resultant complex of the semiconductor chip 6 and the light-transmitting substrate: 1 so as to form a resin coating 7. Thus, the semiconductor device has been fabricated.

As has been described, by conducting curing of the photo-thermal cross-linkable insulating resin through the first and second curing steps, the portion of the photo-thermal cross-linkable insulating resin which remains uncured at the first curing step is also cured. Moreover, the semiconductor chip 6 is electrically connected to the circuit conductor layer 2 with more stability because alloy layers are formed in the abutting portions between the plated metal layers 3 and the metal bumps 4 and in the abutting portions between the plated metal layers 3 and the circuit conductor layer 2. Accordingly, the mounting of the semiconductor chip 6 becomes more secure.

Figure 2:
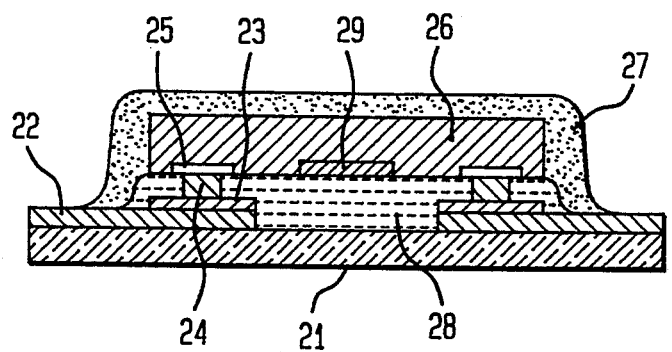
FIG. 2 is a view showing a front cross-section of an image sensor device according to the present invention.
Figure 3:
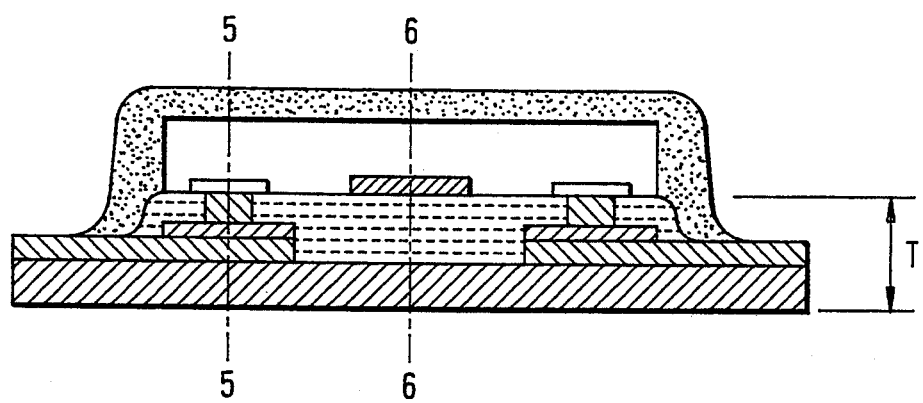
FIG. 3 is a view showing a front cross-section of an image sensor device according to the present invention.
Figure 4:
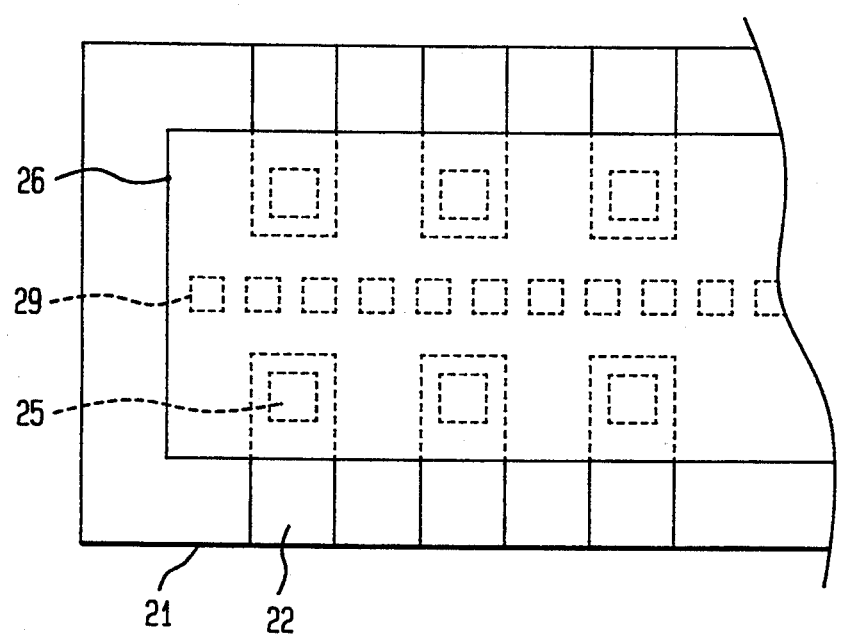
FIG. 4 is a top view showing an image sensor device according to the present invention.
Figure 5:
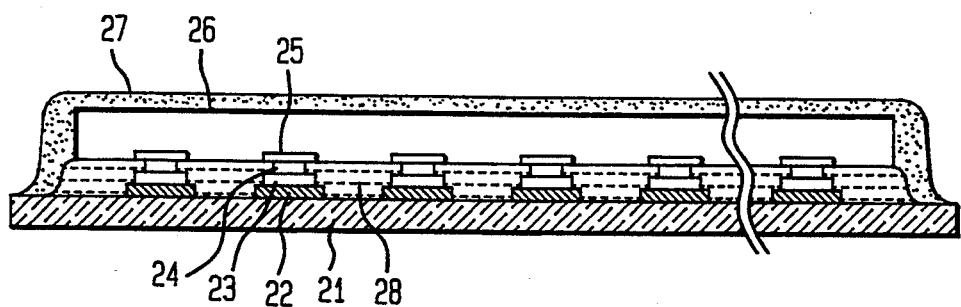
FIG. 5 is a view showing a cross-section of the image sensor device shown in FIG. 3 taken along Line A–A'.
Figure 6:
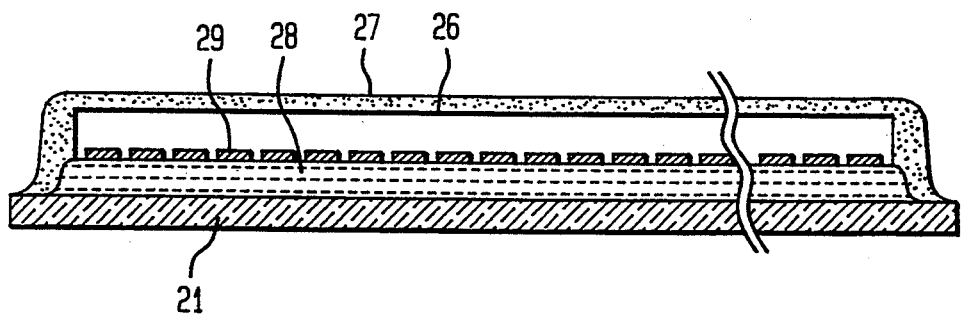
FIG. 6 is a view showing a cross-section of the image sensor device shown in FIG. 3 taken along Line B–B'.

Hereinafter, an image sensor device according to the present invention will be described with reference to FIGS. 2, 3, 4, 5, and 6. FIG. 2 shows a cross-section of the image sensor device. FIG. 4 is a top view of the image sensor device. FIGS. 5 and 6 show cross-sections of the image sensor device taken along, respectively, Line 5—5 and Line 6—6 in FIG. 3, which also shows the front cross-section of the image sensor device.

A light-transmitting substrate 21 is a transparent film made of polyarylate (PA), polyethersulfone (PES), polyethylene terephthalate (PET), polyethylene naphthalate (PEN), or the like, but may alternatively be a glass substrate as in the case of the above-described semiconductor device. In cases of a contact type image sensor device, the thickness $T_s$ of the light-transmitting substrate 21 should be in the range of 0.5 mm to 2.0 mm. In cases of a direct-contact type image sensor device, $T_s$ should be in the range of 10 $\mu$m to 200 $\mu$m, and more preferably, in the range of 10 $\mu$m to 75 $\mu$m.

On a first surface of the light-transmitting substrate 21, a circuit conductor layer 22 made of a metal such as Cu or Al, or a precious metal such as Au or Ag-Pt is formed. The thickness $T_o$ of the circuit conductor layer 22 should be in the range of 3 $\mu$m to 35 $\mu$m.

As is shown in FIGS. 4 and 6, an image sensor chip 26 has electrodes 25, light-sensitive elements 29, and various other device elements (not shown) formed on a surface thereof. The light-sensitive elements 29 may be phototransistors, photodiodes, etc., forming a light-sensitive element array. The other device elements are access circuits including CCDs (Charge Coupled Devices), MOS (Metal Oxide Semi-conductor)-ICs (Integrated Circuits), or bipolar ICs. On each electrode 25, a metal bump 24 is formed. The metal bumps 24 are made of Au. The thickness $T_b$ of each metal bump 24 should be in the range of 3 $\mu$m to 60 $\mu$m. However, the metal bumps 24 are not essential components of an image sensor device according to the present invention.

The image sensor chip 26 is mounted face-down on the first surface of the light-transmitting substrate 21. Between the semiconductor chip 26 and the light-transmitting substrate 21, a photo-thermal cross-linkable insulating resin layer 28 is formed so as to fix the image sensor chip 26 on the light-transmitting substrate 21. The photo-thermal cross-linkable insulating resin is an acrylate-type transparent resin in the present example, but may alternatively be a methacrylate-type resin, or the like. The electrodes 25 of the image sensor chip 26 are connected to the circuit conductor layer 22 by way of plated metal layers 23 formed in at least a portion of the circuit conductor layer 22. More specifically, the plated metal layers 23 are melted on the circuit conductor layer 22 and thereafter are recoagulated thereon so as to form an alloy layer in an abutting portion between each plated metal layer 23 and the circuit conductor layer 22. At the same time, the plated metal layers 23 are melted on the metal bumps 24 as well, so as to form an alloy layer in an abutting portion between each plated metal layer 23 and each metal bump 24. The metal bumps 24 are thus connected to the circuit conductor layer 22, by way of the alloy layers formed in the abutting portions between the metal bumps 24 and the plated metal layers 23 and by way of the alloy layers formed in the abutting portions between the plated metal layers 23 and the circuit conductor layer 22. In cases where no metal bump is provided, an alloy layer is formed in an abutting portion between each electrode 25 and each plated metal layer 23 in a similar process to that mentioned above, while an alloy layer is similarly formed in the abutting portion between each plated metal layer 23 and the circuit conductor layer 22. The plated metal layers 23 can be made of solder of an In/Ga group, an In/Sn group, or a Pb/Sn group in both cases. The thickness $T_m$ of each plated metal layer 23 should be in the range of 2 $\mu$m to 20 $\mu$m.

In cases where the above-mentioned image sensor device is used as a direct-contact type image sensor device, the distance T between the array of the light-sensitive elements 29 and a second surface (i.e. back side) of the light-transmitting substrate 21 should be 150 $\mu$m or less, and preferably 100 $\mu$m or less. Herein, the distance T is defined as a sum total of the thicknesses $T_s$, $T_o$, $T_b$, and $T_m$.

Figure 7:
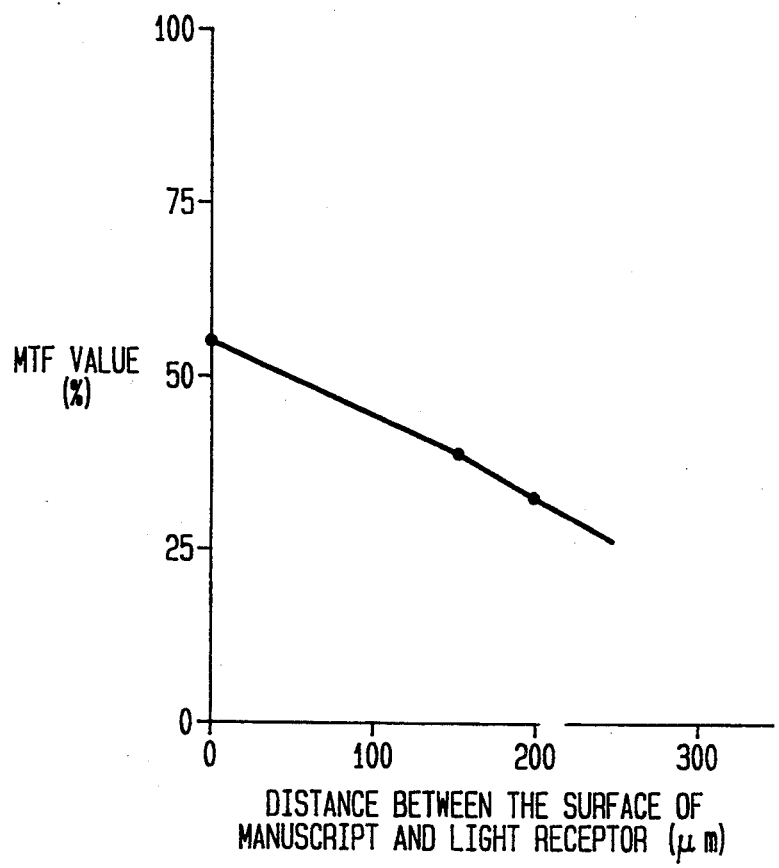
FIG. 7 is a graph showing MTF values (4 lp/mm) of a direct-contact type image sensor device as a function of distances between the surface of a manuscript and a light-sensitive element of the image sensor device.
Figure 8:
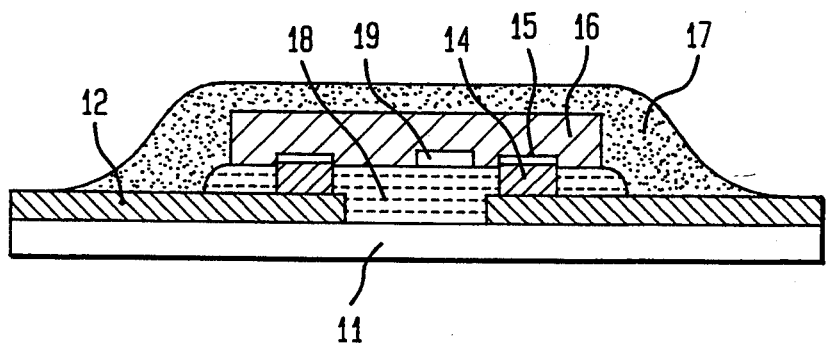
FIG. 8 is a view showing a front cross-section of a conventional image sensor device.

The distance T should be within the above-mentioned range because the resolution of a direct-contact type image sensor device greatly depends on the distance T between the light-sensitive elements 29 and the surface of a manuscript (i.e. the second surface of the light-transmitting substrate 21) to be read by the image sensor device. FIG. 7 describes this relationship between the resolution of a direct-contact type image sensor device and the distance T. In FIG. 7, MTF (Modulation-Transfer-Function) values are taken as the axis of ordinates. An MTF value indicates the resolution degree of an image sensor device, etc. In terms of practicality, an MTF value of 30% to 40% or more is required at 4 lp/mm., thus limiting the distance T to be within the above-mentioned range.

Hereinafter, a method for producing the above-mentioned image sensor device will be described.

First, the image sensor chip 26 is fabricated in the following manner: By a semiconductor-fabricating process, phototransistors serving as the light-sensitive elements 29, a driving circuit (not shown) and the electrodes 25 are formed on a single-crystal silicon substrate (silicon wafer). The metal bumps 24 are formed on the electrodes 25 by such methods as an electric plating method and a ball-bonding method. The metal bumps 24 are made of Au in the present example. Then, the silicon wafer is cut out by a fine dicing technique so as to form the image sensor chip 26.

Next, the circuit conductor layer 22 is formed on the first surface of the light-transmitting substrate 21. The light-transmitting substrate 21 is a transparent film made of polyarylate (PA), polyethersulfone (PES), polyethylene terephthalate (PET), polyethylene naphthalate (PEN), or the like, but may alternatively be a glass substrate. The circuit conductor layer 22 may be formed by depositing a layer of metal such as Cu or Al on the light-transmitting substrate 21 by a sputtering method, a vapor deposition method or the like and then patterning the deposited layer by a photolithography method. The circuit conductor layer 22 may alternatively be formed using a metal foil or the like. Moreover, the circuit conductor layer 22 may alternatively be made of a precious metal such as Au or Ag—Pt. Moreover, the circuit conductor layer 22 may alternatively be formed by attaching a flexible printed wiring board to the first surface of the light-transmitting substrate 21. Furthermore, the circuit conductor layer 22 may alternatively be formed by a thick-film printing method.

Moreover, the plated metal layers 23 are formed in prescribed portions of the circuit conductor layer 22 by an electrolysis method, a non-electrolysis method, or other known methods.

Then, the photo-thermal cross-linkable insulating resin layer 28 is formed by applying a prescribed amount of an acrylate-type transparent insulating resin which is to be cured by use of light and heat to a prescribed portion of the first surface of the light-transmitting substrate 21 by a stamping method, a screen printing method, etc. The image sensor chip 26 having the electrodes 25, the light-sensitive elements 29, and the like on a surface thereof is disposed face-down on the photo-thermal cross-linkable insulating resin layer 28 so that the electrodes 25 abut the plated metal layers 23. Then, while the image sensor chip 26 is pressed onto the light-transmitting substrate 21, the photo-thermal cross-linkable insulating resin layer 28 is irradiated with ultra violet rays through the light-transmitting substrate 21 so as to be cured (First curing step). Herein, the ultra violet rays are radiated from the second surface of the light-transmitting substrate 21 onto the photo-thermal cross-linkable insulating resin layer 28.

The image sensor chip used in the present example has 15 electrodes. A pressure in the range of 0.5 kgf to 2.5 kgf is applied to the image sensor chip 26 from above. While the above-mentioned pressure is applied to the image sensor chip 26, the photo-thermal cross-linkable insulating resin layer 28 is irradiated with ultra violet rays having an intensity in the range of 100 mW to 1500 mW for 20 to 100 seconds. In view of mass-production effects, it is preferable that the first curing step be completed in 20 to 40 seconds.

Then, the light-transmitting substrate 21 with the image sensor chip 26 disposed thereon is placed in an electric furnace so as to be heated at a certain temperature for a while so that the photo-thermal cross-linkable insulating resin is further cured (Second curing step). The temperature should be higher than the melting point of the plated metal layers 23 and than the curing temperature of the photo-thermal cross-linkable insulating resin. In cases where eutectic solder is used as the plated metal layers 23, the heat treatment is conducted at a temperature in the range of 185° C. to 200° C. for about 5 to 30 minutes. In the present example, the heat treatment is conducted at 190° C for 10 minutes. At the second curing step, the plated metal layers 23 are melted so that alloy layers are formed in abutting portions between the metal bumps 24 and the plated metal layers 23, and in abutting portions between the plated metal layers 23 and the circuit conductor layer 22.

The following effects, which are similar to those in the case of the earlier-mentioned semiconductor device, are obtained by melting the plated metal layers 23 at the above-mentioned second curing step: Since each plated metal layer 23 becomes liquid so as to have a configuration with minute superficial rises and falls corresponding to those of the abutting portion of each electrode 25, the plated metal layers 23 and the electrodes 25 can contact in a larger area. Moreover, the alloy layers are more easily formed in the above-mentioned abutting portions, thus further securing the connection between the plated metal layers 23 and the electrodes 25. Moreover, if organic dusts are present on surfaces of the plated metal layers 23 and the electrodes 25, such organic dusts can be removed.

At the first curing step, a portion of the photo-thermal cross-linkable insulating resin which is in the shade of the circuit conductor layer 22 formed on the light-transmitting substrate 21 remains uncured. That portion of the photo-thermal cross-linkable insulating resin is, however, completely cured during the second curing step, so that the mounting of the image sensor chip 26 is completed. The heat treatment at the second curing step is conducted while a pressure of 0 to 1.0 kgf is applied to the image sensor chip 26 from above so that the image sensor chip 26 is pressed against the light-transmitting substrate 21.

After the mounting of the image sensor chip 26 is completed, a resin such as that made of silicon is applied by means of a dispenser, etc. on a resultant complex of the image sensor chip 26 and the light-transmitting substrate 21 so as to form a resin coating 27. Thus, the image sensor device has been fabricated.

Figures 9, 10:
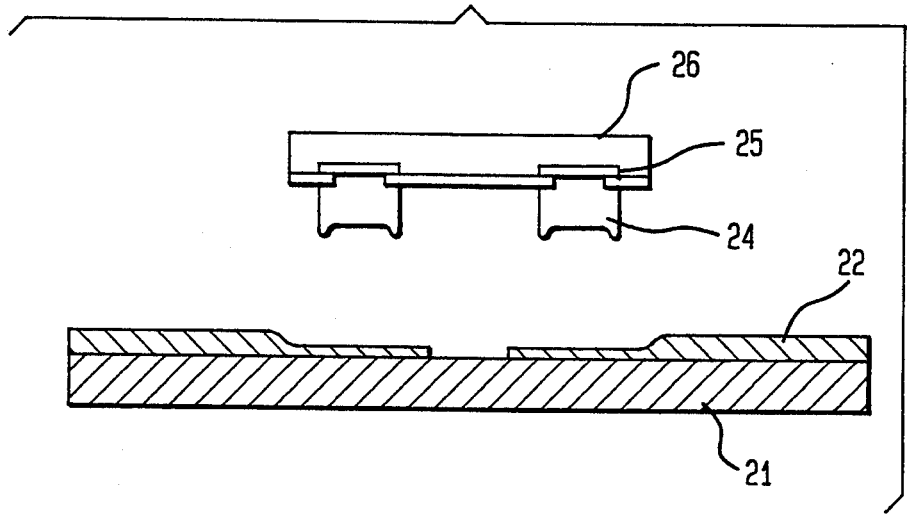
FIG. 9 is a view showing a step in the fabrication of a conventional image sensor device.
FIG. 10 is a table showing the mounting yield of the image sensor device when either a one-step or a two-step curing process is used.

As is described above, a portion of the photo-thermal cross-linkable insulating resin remains uncured at the first curing step, since the curing is conducted only by irradiation with light (ultra violet rays). Therefore, if the second curing step is not conducted, mounting defects occur in an environmental test and the like to be conducted later on. Table 1 shows results of an environmental test with respect to a case where only the first curing step (i.e. curing by light-irradiation) is conducted, and to a case where both the first and second curing steps (i.e. curing by light-irradiation and curing by heat treatment) are conducted. As is seen from Table 1, no defects are found when the photo-thermal cross-linkable insulating resin is cured by both light-irradiation and heat treatment, in either of a case where the image sensor device is kept in a thermo-hygro static state (temperature: 85° C., humidity: 85%) or a case where heat shocks (between −30° C. and +70° C.) are given to the image sensor device. On the other hand, about 40% to 60% of all the image sensor devices that are subjected to the test are found defective when the photo-thermal cross-linkable insulating resin is cured only by light-irradiation. In other words, the mounting yield of the image sensor devices can be improved by conducting two steps of curing, that is, curing by light-irradiation and curing by heat treatment. Moreover, as is seen from the results tabulated in the Table of FIG. 10., the image sensor devices are prevented from deterioration, leading to improvement in the endurance thereof.

As has been described, according to the present invention, electrodes (or bumps) formed on a semiconductor chip or an image sensor chip can have a firm electrical connection to a circuit conductor layer formed on a substrate, since plated metal layers are formed on the circuit conductor layer. Therefore, a reliable semiconductor device and a reliable image sensor device can be provided. Moreover, the semiconductor device and the image sensor device each can be firmly mounted on a light-transmitting substrate, since a photo-thermal cross-linkable insulating resin included therein is completely cured through first and second curing steps, greatly improving the mounting yield of the devices. Moreover, the semiconductor device and the image sensor device are prevented from deterioration, leading to improvement in the endurance thereof.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device comprising the steps of:

forming a circuit conductor layer on a first surface of a light-transmitting substrate having the first surface and a second surface;

forming a plated metal layer on at least a portion of the circuit conductor layer;

forming a photo-thermal cross-linkable insulating resin layer on the first surface of the light-transmitting substrate;

disposing a semiconductor chip having electrodes on a surface thereof face-down so that the electrodes are in contact with the plated metal layer;

conducting a first curing step for curing the photo-thermal cross-linkable insulating resin by radiating ultra violet rays through the light-transmitting substrate from the second surface of the light-transmitting substrate while pressing the semiconductor chip against the light-transmitting substrate; and conducting a second curing step for further curing the photo-thermal cross-linkable insulating resin by heating the light-transmitting substrate with the semiconductor chip disposed thereon at a certain temperature for a period of time, the temperature being higher than the melting point of the plated metal layer and than the curing temperature of the photo-thermal cross-linkable resin.

2. A method according to claim 1, wherein the second curing step further comprises a step for forming an alloy layer in an abutting portion between each plated metal layer and the circuit conductor layer and for forming a second alloy layer in an abutting portion between each plated metal layer and each electrode, the alloy layers being formed by melting the plated metal layer.

3. A method according to claim 1, wherein the semiconductor chip further comprises a metal bump formed on each electrode, and the second curing step further comprises a step for forming an alloy layer in an abutting portion between each plated metal layer and the circuit conductor layer and for forming a second alloy layer in an abutting portion between each metal bump and each plated metal layer, the alloy layers being formed by melting the plated metal layer.

4. A method according to claim 1, wherein the second curing step is conducted while the semiconductor chip is pressed against the light-transmitting substrate.

5. A method according to claim 1, wherein the step for forming the circuit conductor layer includes: a step for forming a conductor layer on the first surface of the light-transmitting substrate; and a step for forming the circuit conductor layer by patterning the conductor layer by a photolithography method.

6. A method according to claim 1, wherein the step for forming the circuit conductor layer is conducted by attaching a flexible printed wiring board to the first surface of the light-transmitting substrate.

7. A method for producing an image sensor device comprising the steps of:

forming a circuit conductor layer on a first surface of a light-transmitting substrate having the first surface and a second surface;

forming a plated metal layer in at least a portion of the circuit conductor layer;

forming a photo-thermal cross-linkable insulating resin layer on the first surface of the light-transmitting substrate;

disposing an image sensor chip having electrodes and at least one light-sensitive element on a surface thereof face-down so that the electrodes are in contact with the plated metal layer;

conducting a first curing step for curing the photo-thermal cross-linkable insulating resin by radiating ultra violet rays through the light-transmitting substrate from the second surface of the light-transmitting substrate while pressing the image sensor chip against the light-transmitting substrate; and conducting a second curing step for further curing the photo-thermal cross-linkable insulating resin by heating the light-transmitting substrate with the image sensor chip disposed thereon at a certain temperature for a period of time, the temperature being higher than the melting point of the plated metal layer and than the curing temperature of the photo-thermal cross-linkable resin.

8. A method according to claim 7, wherein the second curing step further comprises a step for forming an alloy layer in an abutting portion between each plated metal layer and the circuit conductor layer and for forming a second alloy layer in an abutting portion between each plated metal layer and each electrode, the alloy layers being formed by melting the plated metal layer.

9. A method according to claim 7, wherein the semiconductor chip further comprises a metal bump formed on each electrode, and the second curing step further comprises a step for forming an alloy layer in an abutting portion between each plated metal layer and the circuit conductor layer and for forming a second alloy layer in an abutting portion between each metal bump and each plated metal layer, the alloy layers being formed by melting the plated metal layer.

10. A method according to claim 7, wherein the second curing step is conducted while the image sensor chip is pressed against the light-transmitting substrate.

11. A method according to claim 7, wherein a sum total of the thickness of the light-transmitting substrate and the thickness of the photo-thermal cross-linkable insulating resin layer is 150 μm or less.

12. A method according to claim 7, wherein the step for forming the circuit conductor layer includes: a step for forming a conductor layer on the first surface of the light-transmitting substrate; and a step for forming the circuit conductor layer by patterning the conductor layer by a photolithography method.

13. A method according to claim 7, wherein the step for forming the circuit conductor layer includes a step for forming the circuit conductor layer by attaching a flexible printed wiring board to the first surface of the light-transmitting substrate.

14. A method according to claim 7, wherein the step for forming the circuit conductor layer includes a step for forming the circuit conductor layer on the first surface of the light-transmitting substrate by a thick-film printing method.

* * * * *